United States Patent
Narasimhan et al.

(10) Patent No.: US 7,981,800 B1
(45) Date of Patent: Jul. 19, 2011

(54) SHALLOW TRENCH ISOLATION STRUCTURES AND METHODS FOR FORMING THE SAME

(75) Inventors: Geethakrishnan Narasimhan, Santa Clara, CA (US); Mehran Sedigh, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 1027 days.

(21) Appl. No.: 11/509,932

(22) Filed: Aug. 25, 2006

(51) Int. Cl.
H01L 21/8238 (2006.01)
H01L 21/336 (2006.01)
H01L 21/311 (2006.01)
H01L 21/461 (2006.01)

(52) U.S. Cl. ........ 438/689; 438/218; 438/294; 438/700; 438/717; 438/725; 257/E21.218; 257/E21.252; 257/E21.256; 257/E21.628; 257/E21.642

(58) Field of Classification Search ........... 257/E21.628, 257/E21.642, E21.218, E21.232, E21.252, 257/E21.256
See application file for complete search history.

(56) References Cited

U.S. PATENT DOCUMENTS

| | | | |
|---|---|---|---|
| 5,726,093 A | 3/1998 | Yoo | |
| 5,731,241 A | 3/1998 | Jang et al. | |
| 5,807,789 A | 9/1998 | Chen et al. | |
| 5,811,345 A | 9/1998 | Yu et al. | |
| 5,858,857 A | 1/1999 | Ho | |
| 5,866,465 A | 2/1999 | Doan et al. | |
| 5,880,004 A | 3/1999 | Ho | |
| 5,950,090 A | 9/1999 | Chen et al. | |
| 6,017,800 A | 1/2000 | Sayama et al. | |
| 6,048,775 A * | 4/2000 | Yao et al. | 438/427 |
| 6,081,662 A | 6/2000 | Murakami et al. | |
| 6,165,843 A | 12/2000 | Sung | |
| RE37,158 E | 5/2001 | Lee | |
| 6,245,684 B1 | 6/2001 | Zhao et al. | |
| 6,251,748 B1 | 6/2001 | Tsai | |
| 6,255,682 B1 | 7/2001 | Wu | |
| 6,283,131 B1 * | 9/2001 | Chen et al. | 134/1.2 |
| 6,323,103 B1 | 11/2001 | Rengarajan et al. | |
| 6,580,117 B2 | 6/2003 | Shimizu | |
| 6,596,608 B2 | 7/2003 | Saito | |

(Continued)

FOREIGN PATENT DOCUMENTS

JP 2003-086568 * 3/2003

OTHER PUBLICATIONS

USPTO Notice of Allowance for U.S. Appl. No. 09/207,713, dated Jul. 22, 2004; 6 pages.

(Continued)

*Primary Examiner* — Savitri Mulpuri
*Assistant Examiner* — Mohsen Ahmadi

(57) ABSTRACT

A shallow trench isolation (STI) structure and method for forming the same is provided that reduces defects in a nitride film used as a field oxide mask and variations in pad oxide thickness. Generally, the method involves depositing a nitride over pad oxide on a substrate using plasma enhanced chemical vapor deposition (PECVD), and patterning the PECVD nitride to form a field oxide mask. In certain embodiments, patterning the PECVD nitride involves: (i) forming a patterned resist layer on the PECVD nitride; (ii) etching in a process chamber at least one opening through at least the PECVD nitride; and (iii) stripping the patterned resist layer in-situ in the same process chamber in which the at least one opening was etched through the PECVD nitride using a fluorine based plasma. Other embodiments are also disclosed.

11 Claims, 7 Drawing Sheets

U.S. PATENT DOCUMENTS

| | | | |
|---|---|---|---|
| 6,773,975 B1 | 8/2004 | Ramkumar et al. | |
| 6,825,544 B1 | 11/2004 | Jin | |
| 7,176,138 B2 * | 2/2007 | Chen et al. | 438/700 |
| 7,235,491 B2 * | 6/2007 | Weng et al. | 438/704 |
| 7,288,482 B2 * | 10/2007 | Panda et al. | 438/689 |
| 2002/0111046 A1 * | 8/2002 | Park et al. | 438/981 |
| 2003/0181022 A1 * | 9/2003 | Mehrad et al. | 438/437 |
| 2005/0151180 A1 * | 7/2005 | Chiang | 257/298 |
| 2006/0220181 A1 * | 10/2006 | Cheng et al. | 257/595 |

OTHER PUBLICATIONS

USPTO Non-Final Rejection for U.S. Appl. No. 09/207,713, dated Dec. 17, 2004; 10 pages.

USPTO Advisory Action for U.S. Appl. No. 09/207,713, dated Oct. 2, 2003; 3 pages.

USPTO Final Rejection for U.S. Appl. No. 09/207,713, dated Jun. 11, 2003; 11 pages.

USPTO Non-Final Rejection for U.S. Appl. No. 09/207,713, dated Nov. 2, 2002; 8 pages.

USPTO Advisory Action for U.S. Appl. No. 09/207,713, dated Aug. 1, 2002; 3 pages.

USPTO Final Rejection for U.S. Appl. No. 09/207,713, dated May 24, 2002; 11 pages.

USPTO Final Rejection for U.S. Appl. No. 09/207,713, dated Mar. 13, 2002; 8 pages.

USPTO Advisory Action for U.S. Appl. No. 09/207,713, dated Jun. 12, 2001; 2 pages.

USPTO Final Rejection for U.S. Appl. No. 09/207,713, dated Mar. 28, 2001; 6 pages.

USPTO Non-Final Rejection for U.S. Appl. No. 09/207,713, dated Nov. 9, 2000; 8 pages.

USPTO Advisory Action for U.S. Appl. No. 09/207,713, dated Sep. 22, 2000; 2 pages.

USPTO Final Rejection for U.S. Appl. No. 09/207,713, dated Jul. 18, 2000; 8 pages.

USPTO Non-Final Rejection for U.S. Appl. No. 09/207,713, dated Feb. 17, 2000; 10 pages.

USPTO Requirement Restriction for U.S. Appl. No. 09/207,713, dated Oct. 8, 1999; 4 pages.

USPTO Notice of Allowance for U.S. Appl. No. 10/326,707, dated Mar. 2, 2004; 8 pages.

USPTO Non-Final Rejection for U.S. Appl. No. 10/326,707, dated Aug. 22, 2003; 7 pages.

* cited by examiner

US 7,981,800 B1

SHALLOW TRENCH ISOLATION STRUCTURES AND METHODS FOR FORMING THE SAME

CROSS-REFERENCE TO RELATED APPLICATIONS

The present application claims the benefit of priority under 35 U.S.C. 119(e) to U.S. Provisional Patent Application Ser. No. 60/714,735, filed Sep. 7, 2005 entitled Shallow Trench Isolation Structures And Methods For Forming The Same, which application is hereby incorporated by reference.

TECHNICAL FIELD

The present invention relates generally to isolation structures for integrated circuits, and more particularly to shallow trench isolation structures and methods for forming the same.

BACKGROUND OF THE INVENTION

Integrated circuit devices typically include a number of active devices, such as transistors formed in a substrate, such as a silicon (Si) wafer, that are separated from one another by isolation structures. Isolation structures help to ensure that active devices can be individually controlled by preventing current flow between adjacent devices. Without sufficient isolation, leakage paths can occur between active devices, leading to a number of undesirable effects.

One commonly employed structure used to isolate elements in an integrated circuit is a shallow trench isolation (STI) structure. FIG. 1 shows a cross-sectional side view of a STI structure formed according a conventional method. Referring to FIG. 1, a typical STI structure 100 includes relatively deep trenches formed in a semiconductor wafer or substrate 102 filled with a deposited silicon-oxide ($SiO_2$) 104 to isolate adjacent active areas 106a, 106b. STI has gained popularity because it allows for higher device density than LOCOS isolation. Shallow trench isolation, however, is not without its share of problems.

In particular, conventional methods or processes of forming a STI structure 100 involve depositing a pad oxide 108 and LPCVD (low pressure chemical vapor deposition) nitride layer (not shown in FIG. 1). The LPCVD nitride layer is patterned using a resist and conventionally photolithography techniques to form a hardmask or Field Oxide Mask. A Field Oxide Mask etch is used to etch through the nitride layer, the pad oxide 108 and gouge into the substrate 102, and any remaining resist stripped or ashed in an oxygen ($O_2$) strip. The deep STI trenches are then etched into the substrate 102 using the LPCVD nitride layer as a Field Oxide Mask, and the STI trenches filled with the deposited $SiO_2$ 104. Typically, as shown in FIG. 1, a liner oxide 110 is grown on exposed surface of the deep STI trenches prior to filling with the deposited $SiO_2$ 104. Finally, the LPCVD nitride layer is stripped to yield the intermediate structure shown in FIG. 1 in which active regions 106a and 106b are separated by STI structures 100.

One problem with conventional STI structures 100 and methods for forming the same is variation in pad oxide 108 thicknesses. Pad oxide thickness is especially critical for transistor threshold voltage (Vt) variation since channel and well implants are done through the pad oxide after the LPCVD nitride layer has been stripped. There are a number of causes for the variation in pad oxide 108 thickness, including variation of nitride to oxide selectivity across the bathlife of a phosphoric bath used to strip the LPCVD nitride layer. For example, in some process flows pad oxide thickness can vary from 70 Å to 135 Å depending on the bathlife of the phosphoric bath. By bathlife it is meant the number of substrates or lots or batches of substrates previously processed in the bath.

Another cause of variation in pad oxide 108 thicknesses arises from tendency of existing LPCVD batch processing techniques to deposit an undesired LPCVD nitride layer on a backside of the substrate. This backside LPCVD nitride layer if not removed generates stresses in the substrate due to coefficient of thermal expansion mismatches that can damage if not destroy the substrate. Typically, the backside LPCVD nitride layer is removed in the phosphoric bath at the same time the front side LPCVD nitride layer is stripped. However, this requires an overetch, which, depending on bathlife, further exacerbates loss or variation in pad oxide 108 thickness.

Finally, due to batch processing and long deposition time of LPCVD nitride deposition in a furnace, there is lack of flexibility of controlling different nitride thicknesses for various process applications. It will be appreciated that this variation in nitride thicknesses can lead to variation in pad oxide 108 thicknesses independent of bathlife.

Another problem with conventional methods for forming STI structures 100 is defectivity. In particular, the LPCVD nitride layer, which is used as a hardmask for forming the deep STI trenches, is deposited in a furnace, does not meet particle and defectivity requirements as devices shrink to smaller line widths.

Prior efforts to avoid some of the above problems with LPCVD nitride by using PECVD (plasma enhanced chemical vapor deposition) nitride have not proven successful. In particular, conventional methods for forming STI structures utilize an in-situ $O_2$ strip to strip any remaining resist following nitride mask open etch which can lead to nitride pinch-off in which the oxide underlying the nitride is under, leading in some instances to a loss of the nitride altogether, and significantly damaging the field oxide mask. An example, of nitride pinch-off is illustrated in FIG. 5, where FIG. 5 is a diagram illustrating an electron microscope image of a sectional side view of a portion of a substrate showing an intermediate structure in a conventional STI fabrication process formed with PECVD nitride and exhibiting nitride pinch-off.

Accordingly, there is a need for a STI structure and a method of forming the same, which significantly reduces variations in pad oxide thickness, and defects in the nitride layer, thereby enabling tailoring of the hardmask dimensions as devices are scaled. There is a further need for an STI process that reduces or eliminates nitride formation on the backside of the substrate, which requires a pad oxide damaging overetch, while substantially avoiding potentially field oxide mask damaging nitride pinch-off.

The present invention provides a solution to these and other problems, and offers further advantages over conventional STI structures and methods of forming the same.

BRIEF DESCRIPTION OF THE DRAWINGS

These and various other features and advantages of the present invention will be apparent upon reading of the following detailed description in conjunction with the accompanying drawings and the appended claims provided below, where:

DETAILED DESCRIPTION

Figure 1:
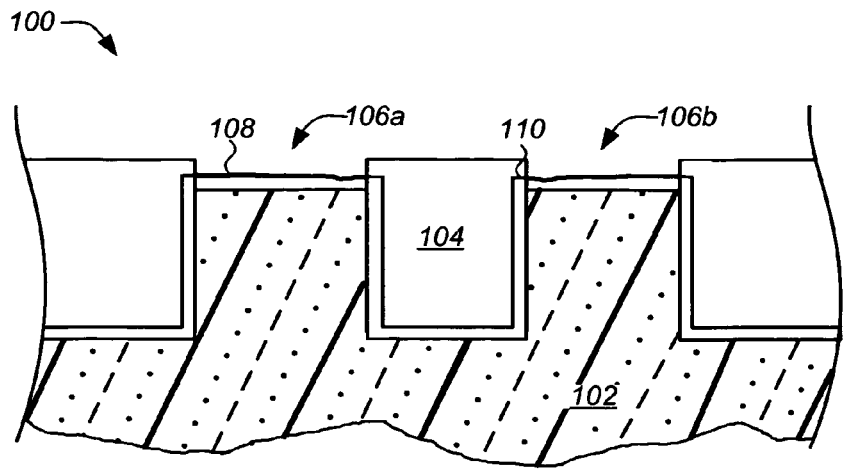
FIG. 1 (Prior Art) is a diagram illustrating a cross-sectional side view of a shallow trench isolation (STI) structure formed according a conventional method.

The present invention is directed generally to isolation structures, and more particularly, to shallow trench isolation (STI) structures and methods for forming the same.

The STI structures and methods of the present invention is particularly useful in advanced technologies having high device densities and devices having reduced line widths, such as to isolate N+/N+ and N+/P+ devices for sub 0.25 um process flows.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The terms "to couple" and "to electrically couple" as used herein may include both to directly connect and to indirectly connect through one or more intervening components.

Briefly, in one aspect the process or method of the present invention involves integrating a PECVD (plasma enhanced chemical vapor deposition) nitride into a STI fabrication process in place of a conventional LPCVD (low pressure CVD) nitride. PECVD nitride exhibits much lower defectivity than LPCVD nitride, which is critical for obtaining higher yields as line-widths scale down. In addition, the inventive method uses a dry etch in place of the conventional phosphoric bath used to strip the STI nitride, thereby substantially eliminating the variation in pad oxide thickness due to variation of nitride to oxide selectivity across a bathlife of the phosphoric bath. Also, depositing PECVD nitride eliminates deposits on backsides of substrate or wafer, thereby eliminating the need for overetch or stripping of the nitride in conventional STI fabrication methods. Finally, the process of the present invention utilizes a fluorine based plasma that is selective to the oxide of the pad oxide to strip any remaining resist, thereby eliminating the need for an in-situ oxygen ($O_2$) strip, and substantially avoiding potentially field oxide mask damaging nitride pinch-off.

Shallow trench isolation (STI) structures and methods for forming the same according to various embodiments of the present invention will now be described in greater detail with reference to FIGS. 2 to 4. For purposes of clarity, many of the details of semiconductor fabrication that are widely known and are not relevant to the present invention have been omitted from the following description.

Figure 2:
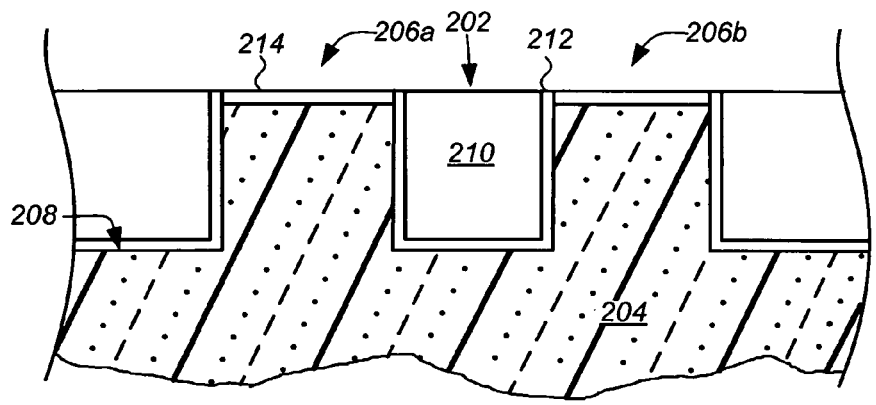
FIG. 2 is a partial cross-sectional view of an intermediate structure in fabrication of a semiconductor device having of a STI structure formed according to an embodiment of the present invention.

FIG. 2 depicts a partial cross-sectional view of an intermediate structure of a semiconductor device 200 having a STI structure 202 formed on a semiconductor wafer or substrate 204 to isolate adjacent active areas 206a, 206b where electrically active elements of the device will be formed. The STI structure 202 includes one or more relatively deep STI trenches 208 formed in the substrate 204, and filled with a deposited oxide 210. Generally, as shown in FIG. 2, the STI structure 202 further includes a liner oxide 212 grown on exposed surface of the STI trench 208 prior to filling with the deposited oxide 210.

The intermediate structure or device 200 further includes a thin layer of oxide known as a pad oxide 214 deposited or grown over the surface of the substrate 204, and through which the STI structure 202 is formed. As noted above, because channel and well implants are implanted through the pad oxide 214 to fabricate active elements in active areas 206a, 206b, control of pad oxide uniformity and thickness both across of a substrate 204 and between lots or batches of sequentially processed substrate is important. Control of pad oxide 214 thicknesses is especially critical to control transistor threshold voltage (Vt) variation.

The substrate 204 may include any known semiconductor material, such as Silicon, Gallium-arsenide, Germanium, Gallium-nitride, Aluminum-phosphide, and mixtures or alloys thereof. Preferably, the substrate 204 is a doped or undoped silicon-based semiconductor substrate, such as a monocrystalline silicon, silicon-germanium, silicon-on-insulator, or silicon-on-sapphire substrate.

Generally, both the pad oxide 214 and the liner oxide 212 include a thin layer or film of a thermally grown silicon-dioxide ($SiO_2$) having a thickness of from about 10 to about 200 angstroms (Å), and more preferably at least about 125 Å.

The STI trench 208 generally have a depth of from about 2000 to about 4000 Å, and a width or cross-section between the active areas 206a, 206b, of from about 80 to about 250 nm.

Figure 3A:
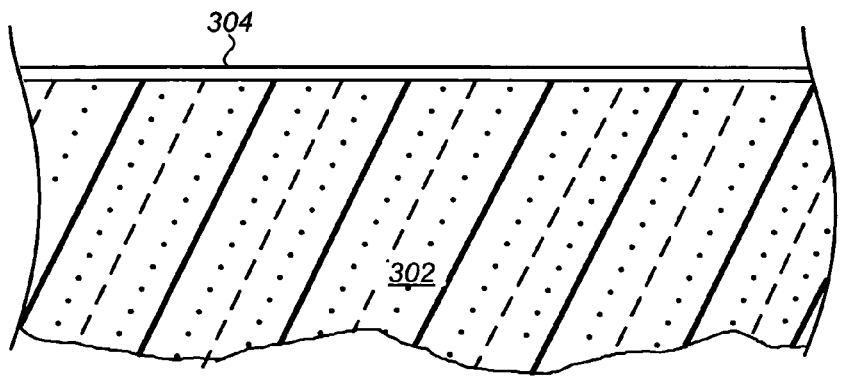
FIGS. 3A to 3I are a series of diagrams illustrating a process sequence for forming a STI structure according to an embodiment of the present invention.
Figure 3B:
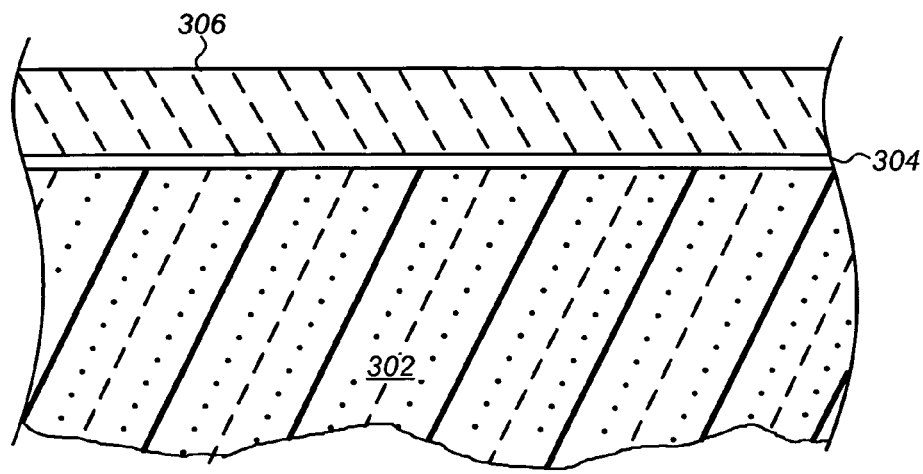
Figure 3C:
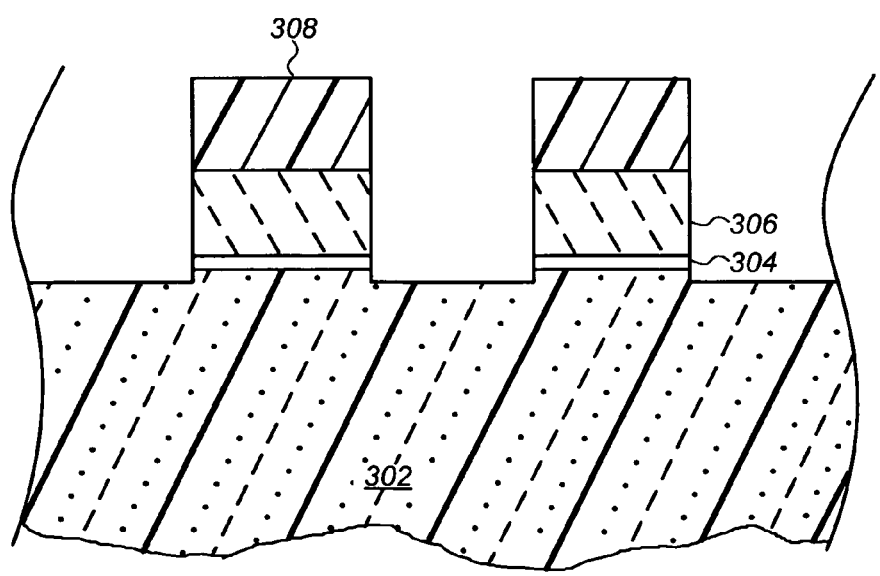
Figure 3D:
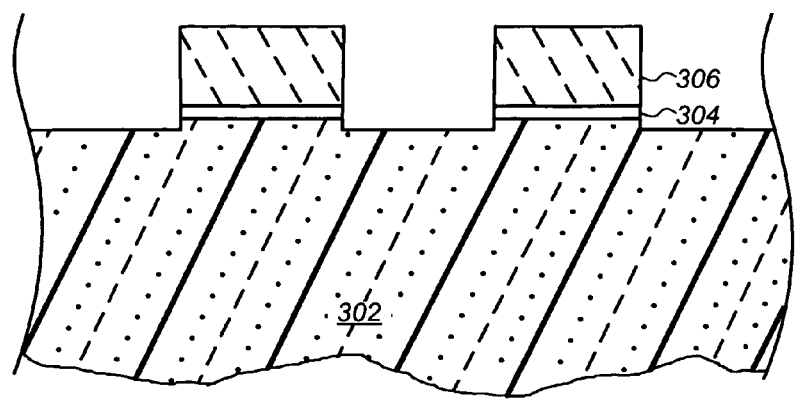
Figure 3E:
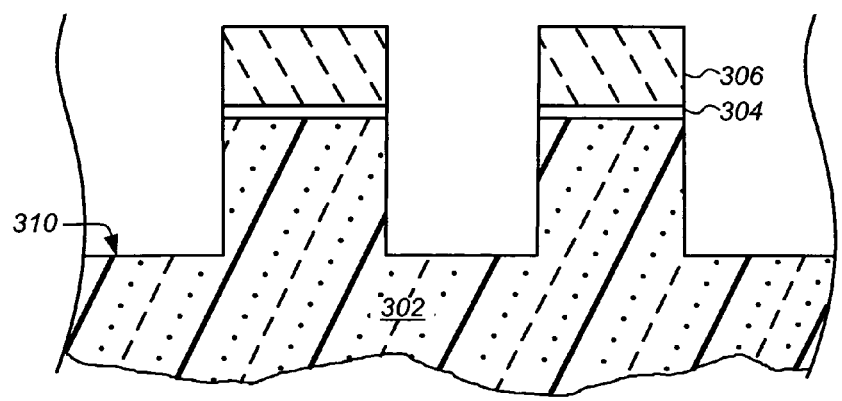
Figure 3F:
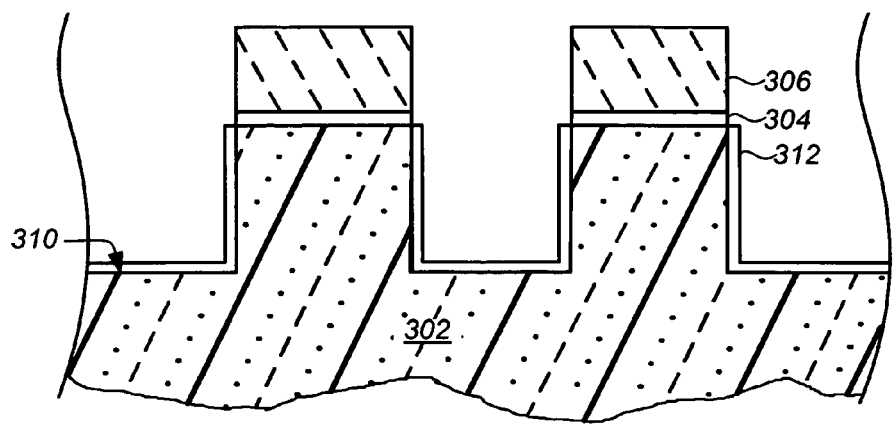
Figure 3G:
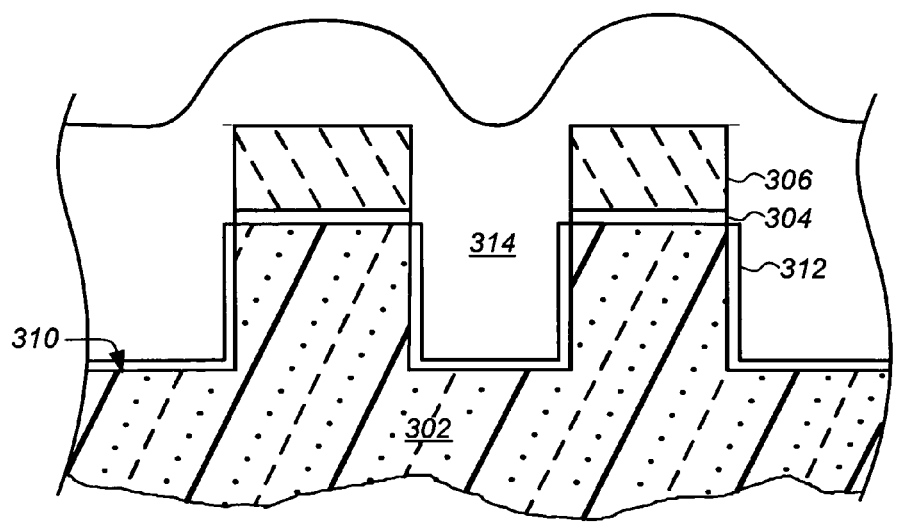
Figure 3H:
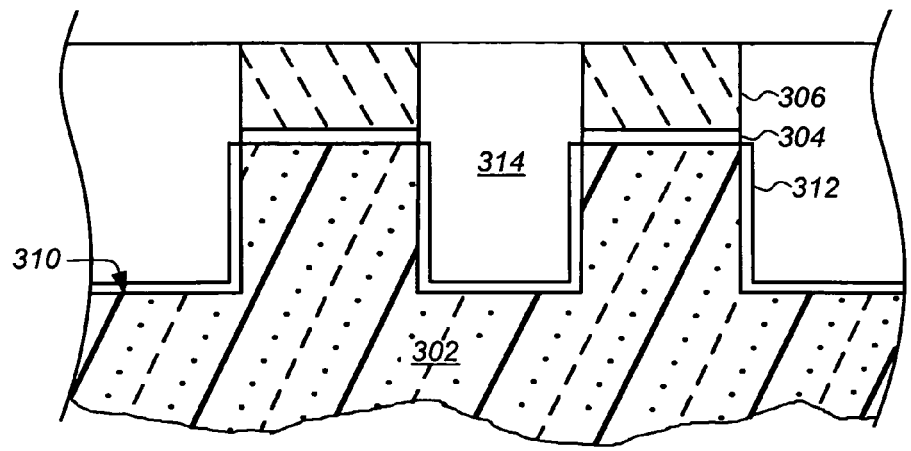
Figure 3I:
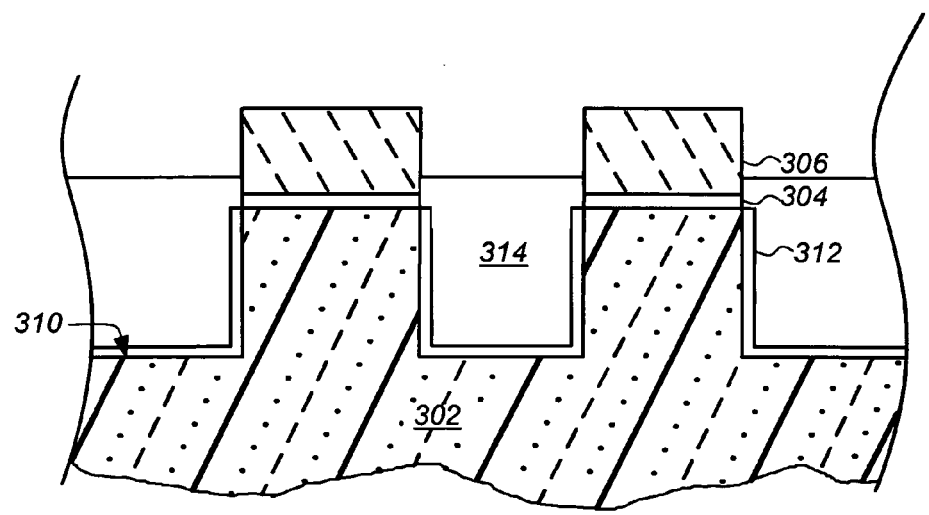
Figure 4:
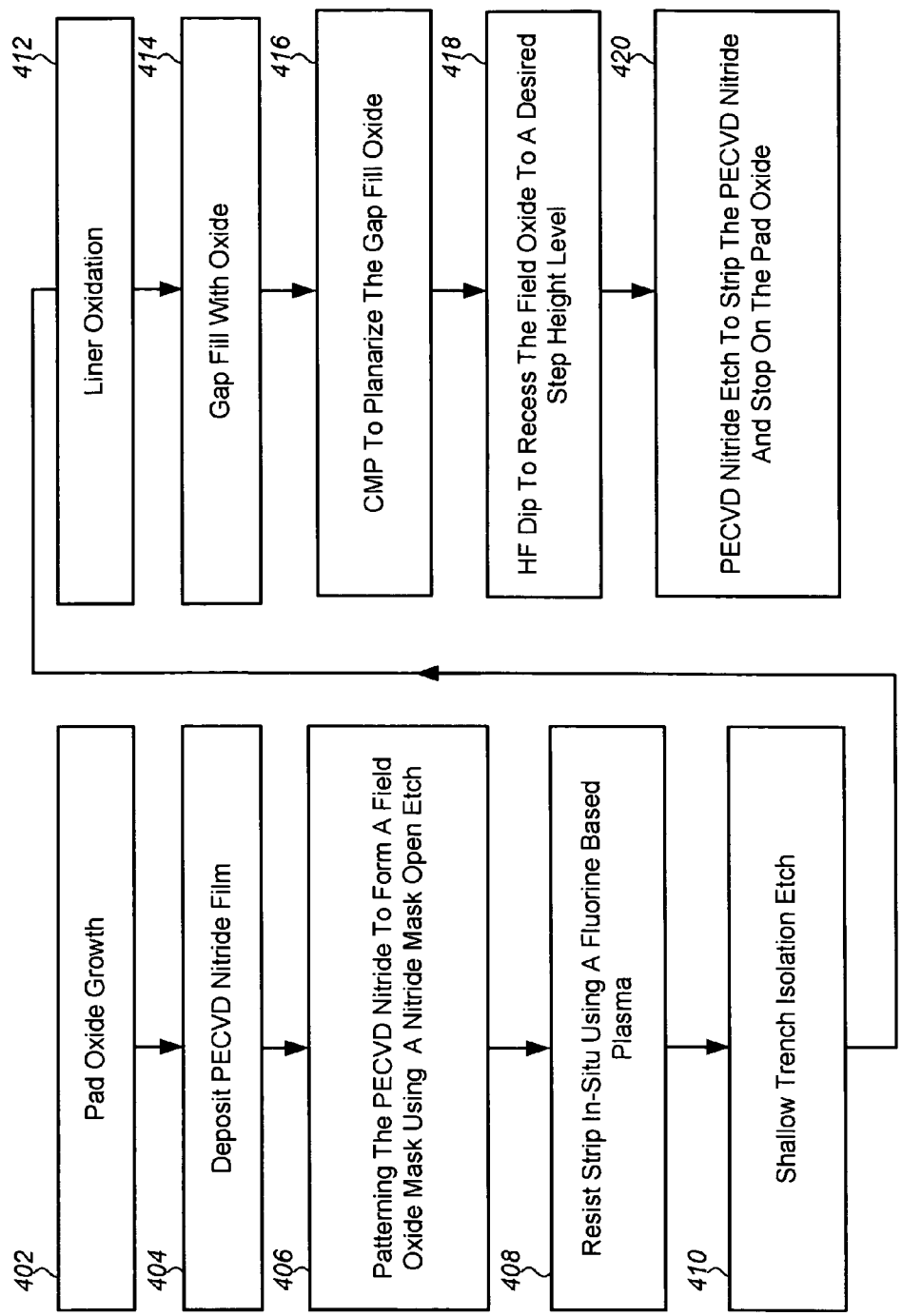
FIG. 4 is a flowchart of a method of manufacturing a STI structure according to an embodiment of the present invention.

Methods for fabricating STI structure according to various embodiments of the present invention will now be described in greater detail with reference to FIGS. 3A through 4, where FIGS. 3A through 3I are a series of diagrams illustrating a process sequence for forming a STI structure, and FIG. 4 is a flowchart of a method according to an embodiment of the present invention.

Referring to FIGS. 3A and 4, the method of the present invention begins with precleaning the substrate 302, followed by forming a pad oxide 304, a thin layer of an oxide, such as silicon-dioxide ($SiO_2$), on the substrate (step 402). This pad oxide 304 can be formed in a number of ways including, for example, using a rinse in ozone ($O_3$) containing deionized water as part of the preclean step, or thermally growing the oxide in a process chamber of a process tool, such as a thermal reactor or furnace.

Referring to FIGS. 3B and 4, after pad oxide growth, a film or layer of PECVD nitride 306 having a desired predetermined thickness is deposited in a chamber of a suitable PECVD tool (step 404). The PECVD nitride film 306 generally has a thickness of from about 500 to about 2000 Å, depending on the geometry or line widths of the device being fabricated. That is devices having smaller line widths generally utilize layers of PECVD nitride 306 having a smaller thickness.

Suitable PECVD tools includes, for example, a Novellus PECVD tool, commercially available from Novellus Systems, Inc. of San Jose, Calif.

Deposition of the PECVD nitride 306 is followed by a number of steps to pattern the PECVD nitride to form a hardmask, known as a Field Oxide Mask, to be used in a subsequent STI trench etch. Referring to FIGS. 3C and 4, the patterning is accomplished using a photo-resist or resist 308, standard photolithographic processes, and a nitride mask open etch, which etches one or more openings through at least the PECVD nitride 306 (step 406). Preferably, the nitride mask open etch is a dry etch performed in the processing chamber of a suitable etching tool. Suitable etching tools includes, for example, an MxP Dielectic Etch Chamber or DSP Poly Etch Chamber, commercially available from Applied Materials, Inc. of Santa Clara, Calif. More preferably, the nitride mask open etch also etches through the underlying pad oxide 304, and gouges approximately 50 to 200 Å into the substrate 302. Most preferably, the nitride mask open etch etches about 100 Å into the substrate 302.

Next, referring to FIGS. 3D and 4, the remaining resist 308 is stripped using fluorine based plasma that is selective to the oxide of the pad oxide 306, thereby avoiding the used of an in-situ oxygen ($O_2$) strip and substantially preventing nitride pinch-off (step 408). A suitable fluorine based plasma includes, for example, carbon-fluoride of the form $CH_xF_y$. Preferably, the resist strip is accomplished in-situ in the same tool used for the nitride mask open etch. More preferably, the resist strip is accomplished in-situ in the same processing chamber without breaking vacuum.

Referring to FIGS. 3E and 4, the resist strip is followed by an STI trench etch to form at least one STI trench 310 into the substrate 302 (step 410). Preferably, the STI trench etch is also performed in-situ in the same tool used for the nitride mask open etch and the resist strip. More preferably, the STI trench etch is accomplished in-situ in the same processing chamber without breaking vacuum. The STI trench etch can be accomplished using any suitable dry etching chemistry for etching a semiconductor or silicon substrate. Suitable STI trench etch chemistries can include, for example, For example, an exemplary STI etch processes according to the method described herein may include one or more of the following etchant or process gases trichloroborane ($BCl_3$), Chlorine ($Cl_2$), oxygen ($O_2$) and hydrogen-bromide (HBr). In addition, the etch chemistry may further include an inert gas, such as argon (Ar), nitrogen (N2), or xenon (Xe).

Referring to FIGS. 3F and 4, the STI etch is followed by liner oxidation or forming of a liner oxide 312 on surfaces of the substrate 302 exposed by the STI trench 310 (step 412). The liner oxide 312 can be formed in a number of ways including, for example, thermally growing the oxide in the same or a separate process chamber of a process tool, such as a thermal reactor or furnace.

Next, the STI trench is filled by forming a conformal field oxide 314 layer over the field oxide mask, the patterned PECVD nitride 306, in a gap fill step, step 414, as shown in FIG. 3G. The field oxide 314 can be formed using any suitable process. Preferably the field oxide 314 is a high density plasma (HDP) oxide deposited using HDP deposition techniques.

Referring to FIGS. 3E and 4, the field oxide layer 314 is planarized using a chemical mechanical polishing or pla-narizing (CMP) process (step 416). Preferably, substantially of the field oxide 314 on top of the PECVD nitride 306 is removed. An additional amount of the field oxide 314 can be removed to recess the field oxide to a desired step height or level above the pad oxide 304 as shown in FIG. 3I. In one embodiment, the substrate 302 with the STI structure formed thereon can be briefly dipped in a hydrofluoric (HF) dip to recess the field oxide to a desired step height (step 418).

Finally, the PECVD nitride 306 is etched with a high selectivity to oxide to strip the PECVD nitride and stop on the pad oxide 304, yielding the intermediate structure shown in FIG. 2 (step 420). Preferably, the step of etching the PECVD nitride is a two step etch in which at least one step involves dry etching the PECVD nitride 304. Dry etch is preferred because the PECVD nitride is densified the during liner oxidation step, and thus the etch rate would vary across film thickness if etched or stripped using the conventional phosphoric bath. In addition, the variations in pad oxide 302 thickness that arise in a conventional STI process across the bath life of a phosphoric bath used to strip nitride are eliminated. In one embodiment, the PECVD nitride etch includes a first etch step using SF6, followed by second etch in a carbon-fluoride chemistry of the form $CH_xF_y$, such as methyl fluoride ($CH_3F$). More preferably, the PECVD nitride etch has a selectivity of PECVD nitride with respect to oxide of at least about 3:1, and more preferably about 5:1 or more.

Figure 6:
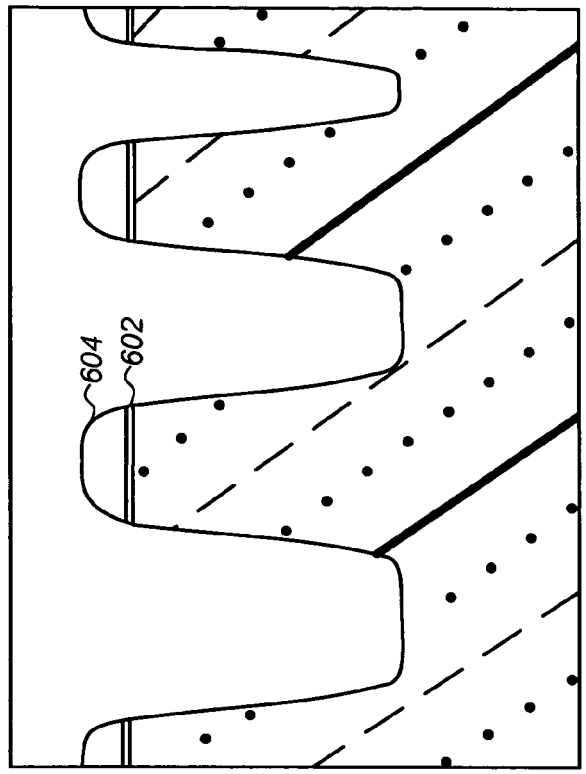
FIG. 6 is a diagram illustrating an electron microscope image of a sectional side view of a portion of a substrate showing an intermediate structure in a STI structure STI fabrication process according to an embodiment of the present invention.
Figure 5:
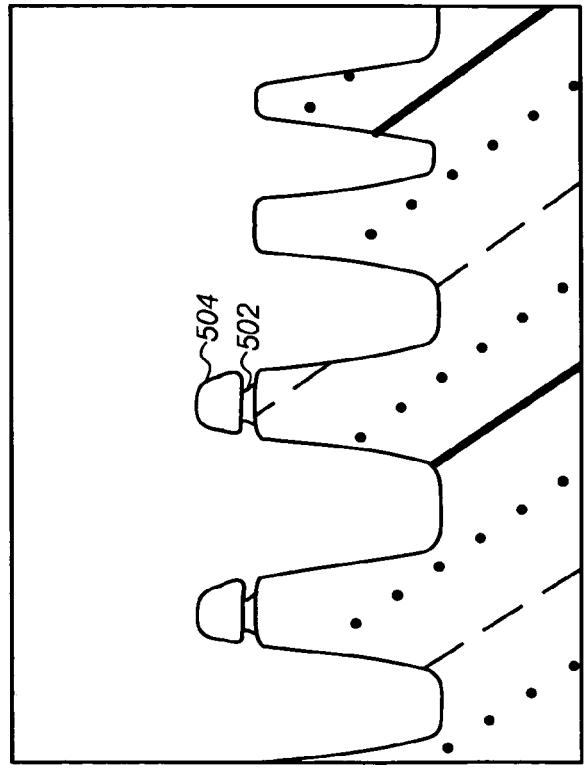
FIG. 5 (Prior Art) is a diagram illustrating an electron microscope image of a sectional side view of a portion of a substrate showing an intermediate structure in a conventional STI fabrication process formed with PECVD (plasma enhanced chemical vapor deposition) nitride and exhibiting nitride pinch-off.

FIGS. 5 and 6 are diagrams illustrating an electron microscope image of a sectional side view of a portion of a substrate showing, respectively, a STI structure formed according to conventional fabrication processes and according to an embodiment of the present invention. In particular, FIG. 5 shows an intermediate structure in a STI fabrication process formed having a 1500 Å PECVD nitride layer, wherein the intermediate structure is formed using a conventional processing method including an etch followed by an in-situ $O_2$ strip and exhibit nitride pinch-off. FIG. 6 shows an STI structure with 1500 Å PECVD nitride formed by a method of the present invention including an integrated etch followed by an in-situ resist strip in fluorine based plasma. Referring to FIG. 5 it is seen that the in-situ $O_2$ strip of the conventional two step STI approach removes some the pad oxide 502 at the nitride-oxide interface, undercutting the PECVD nitride 504, impeding its usefulness as a hardmask or field oxide mask at smaller line widths. In some instances it is seen that the PECVD nitride 504 is lost completely or pinched-off. In contrast the STI structure of FIG. 6 shows substantially no loss or etching of the pad oxide 602 and consequently no undercutting the PECVD nitride 604.

The advantages of the STI structure and method of the present invention over previous or conventional STI structures and methods include: (i) extending usefulness of STI to smaller scale technologies, thereby enabling use of thinner pad oxides for forming STI structures and widening the manufacturing window; (ii) lowering the number of defects in the nitride mask by replacing LPCVD nitride with PECVD based nitride film, i.e., less than about 100 defects at 0.08 μm line widths versus about 300 defects with LPCVD nitride; (iii) elimination of variation in pad oxide thickness across bathlife by replacing or adding a dry etch to the nitride etch; (iv) ability to tailor or precisely control the thickness of the deposited PECVD nitride film, thereby increasing process flexibility; and (v) a highly selective nitride etch chemistry based on a carbon-fluoride chemistry, such as $CH_3F$, providing a selectivity to oxide of at least about 3:1, and more preferably about 5:1.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents. The scope of the present invention is defined by the claims, which includes known equivalents and unforeseeable equivalents at the time of filing of this application.

What is claimed is:

1. A method of manufacturing a semiconductor device having a shallow trench isolation (STI) structure, the method comprising steps of:
   depositing a nitride over a pad oxide on a surface of a substrate, the pad oxide having a thickness of at least 125 angstroms (Å) and the nitride having a thickness of between 500 to 2000 Å;
   forming a patterned resist layer on the nitride;
   etching in a process chamber at least one opening through the nitride and pad oxide using plasma comprising methyl fluoride ($CH_3F$);
   stripping the patterned resist layer in-situ in the same process chamber using fluorine based plasma, to substantially prevent nitride pinch-off; and
   etching at least one STI trench into the substrate, and wherein the etch is accomplished in-situ in the same process chamber used for etching through the nitride and stripping the patterned resist layer.

2. A method according to claim 1, wherein the patterned resist layer is stripped without the use of plasma comprising oxygen ($O_2$).

3. A method of manufacturing a semiconductor device having a shallow trench isolation (STI) structure comprising:
   depositing a plasma enhanced chemical vapor deposition (PECVD) nitride over a pad oxide on a surface of a substrate, the pad oxide having a thickness of at least 125 angstroms (Å) and the nitride having a thickness of between 500 to 2000 Å;
   forming a patterned resist layer on the PECVD nitride;
   etching at least one opening through the PECVD nitride in a process chamber using fluorine based plasma;
   etching at least one opening through the exposed portion of the pad oxide in the process chamber using plasma comprising methyl fluoride ($CH_3F$) to expose at least a portion of the surface of the substrate, wherein etching at least one opening through the PECVD nitride and etching at least one opening through the exposed portion of the pad oxide are accomplished in a single continuous etch using plasma comprising methyl fluoride ($CH_3F$); and
   stripping the patterned resist layer in-situ in the process chamber using fluorine based plasma that does not comprise oxygen ($O_2$), to substantially prevent nitride pinch-off.

4. A method according to claim 3, wherein stripping the patterned resist layer comprises stripping the patterned resist layer using plasma comprising methyl fluoride ($CH_3F$).

5. A method according to claim 3, further comprising etching at least one STI trench into the substrate, and wherein the STI trench etch is accomplished in-situ in the same process chamber used for etching through the PECVD nitride and pad oxide, and for stripping the patterned resist layer.

6. A method according to claim 5, further comprising filling the STI trench with a field oxide, and planarizing the field oxide.

7. A method according to claim 6, further comprising stripping the PECVD nitride to stop on the pad oxide, wherein stripping the PECVD nitride comprises a first etch followed by a dry second etch using fluorine based plasma having a high selectivity of PECVD nitride with respect to oxide.

8. A method according to claim 7, wherein the second etch comprises an etch using plasma comprising methyl fluoride ($CH_3F$).

9. A method comprising:
   depositing a plasma enhanced chemical vapor deposition (PECVD) nitride over a pad oxide on a surface of a substrate;
   forming a patterned resist layer on the nitride;
   etching in a process chamber at least one opening through the nitride and pad oxide using plasma comprising methyl fluoride ($CH_3F$);
   stripping the patterned resist layer in-situ in the same process chamber using fluorine based plasma to substantially prevent pinch-off of the nitride;
   etching in the same process chamber at least one STI trench into the substrate, the STI trench having a depth of from 2000 to 4000 angstroms (Å), and a width of from 80 to 250 nanometers (nm) and
   stripping the PECVD nitride to stop on the pad oxide, wherein stripping the PECVD nitride comprises a first etch followed by a dry second etch using fluorine based plasma having a selectivity of PECVD nitride with respect to oxide of at least about 3:1, wherein stripping the PECVD nitride is accomplished in-situ in the same process chamber used for etching through the nitride, stripping the patterned resist layer and etching the at least one STI trench.

10. A method according to claim 9, further comprising prior to stripping the PECVD nitride filling the STI trench with a field oxide, and planarizing the field oxide.

11. A method according to claim 10, further comprising prior to stripping the PECVD nitride dipping the substrate with the STI trench formed therein in a hydrofluoric (HF) dip to recess the field oxide.

* * * * *